United States Patent [19]

Akasaki et al.

[11] Patent Number: 4,682,207
[45] Date of Patent: Jul. 21, 1987

[54] SEMICONDUCTOR DEVICE INCLUDING LEADLESS PACKAGES AND A BASE PLATE FOR MOUNTING THE LEADLESS PACKAGES

[75] Inventors: Hidehiko Akasaki, Aizuwakamatsu; Takehisa Tsujimura, Kawasaki, both of Japan

[73] Assignee: Fujitsu Limited, Kawasaki, Japan

[21] Appl. No.: 915,851

[22] Filed: Oct. 3, 1986

Related U.S. Application Data

[63] Continuation of Ser. No. 476,262, Mar. 17, 1983.

[30] Foreign Application Priority Data

Mar. 17, 1982 [JP] Japan .................................. 57-42254

[51] Int. Cl.[4] .......................................... H01L 23/32
[52] U.S. Cl. ................................ 357/74; 174/52 FP; 361/413
[58] Field of Search .......................... 357/74, 75, 80; 174/52 R, 52 FP; 339/17 C, 17 CF; 361/400, 412, 413

[56] References Cited

U.S. PATENT DOCUMENTS

| | | | |
|---|---|---|---|
| 4,038,488 | 7/1977 | Lin | 174/52 FP |
| 4,232,815 | 11/1980 | Nakano et al. | 174/52 FP |
| 4,271,426 | 6/1981 | Hargis | 357/74 |
| 4,423,468 | 12/1983 | Gatto et al. | 174/52 FP |
| 4,426,773 | 1/1984 | Hargis | 361/412 |
| 4,493,145 | 1/1985 | Honda | 174/52 FP |

FOREIGN PATENT DOCUMENTS

| | | | |
|---|---|---|---|
| 1258936 | 1/1968 | Fed. Rep. of Germany | 339/17 C |
| 2075958 | 10/1971 | France | |
| 0061044 | 5/1980 | Japan | 357/80 |
| 0159360 | 9/1983 | Japan | 357/75 |
| 81/03396 | 9/1981 | PCT Int'l Appl. | 174/52 FP |
| 1081493 | of 1967 | United Kingdom | 174/52 FP |
| 2090072 | 6/1982 | United Kingdom | 357/75 |

OTHER PUBLICATIONS

*IBM Technical Disclosure Bulletin*, Henle, R. A., "Vertical Chip Packaging", vol. 20, No. 11A, pp. 4339, 4340, (Apr. 1978).
Engineered Electronics Company, *Micro System*, Jan. 1966.
P. F. Iafrate, "High Density and Speed Performance Chip Joining Procedure and Package", 9/1972, *IBM Technical Disclosure Bulletin*, vol. 15, No. 4.
Electronic Design, vol. 29, No. 12, Jun. 1981, "Packaging Struggles to Cover the Spread of VLSI with New Chip Carriers", Waseca, pp. 189-194.
Electronics International, vol. 55, No. 2, Jan. 1982, "Rectangular Chip-Carriers Double Memory-Board Density", Woodruff, pp. 119-123.
Wescon Conference Records, Sep. 1977, "Ceramic Chip Carrier-The New Standard in Packaging?", Burch et al., pp. 1-7.
Funkschau, vol. 57, No. 20, 1979, "ICs für Nf-Leistungsverstärker", Sax, pp. 1145-1147.
Patent Abstracts of Japan, vol. 6, No. 95.

*Primary Examiner*—James W. Davie
*Attorney, Agent, or Firm*—Staas & Halsey

[57] ABSTRACT

A semiconductor device includes a plurality of leadless packages and a base plate for mounting the leadless packages. The leadless packages include a semiconductor chip housed therein and a plurality of electrodes formed on the surface thereof. The base plate has conductor patterns formed on both of two main surfaces thereof, and the electrodes of each leadless package are soldered to the conductor patterns. The base plate also has a plurality of lead pins which project from one edge thereof in parallel with the main surface.

7 Claims, 10 Drawing Figures

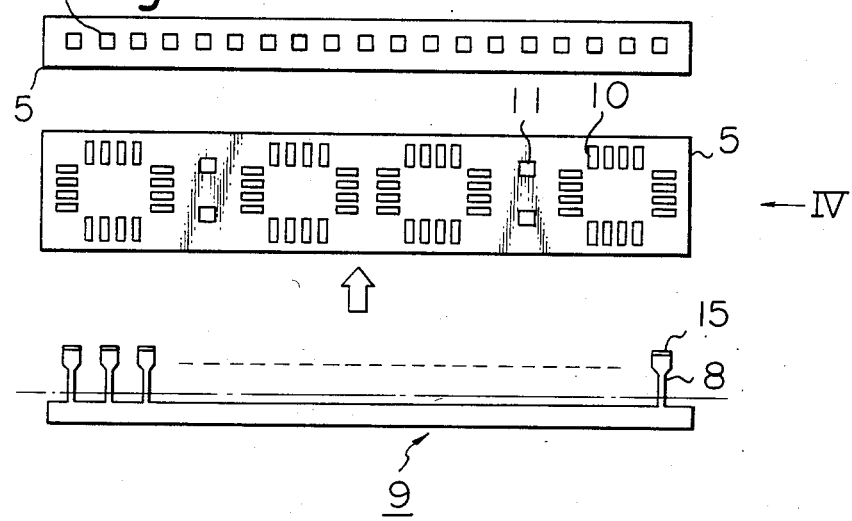
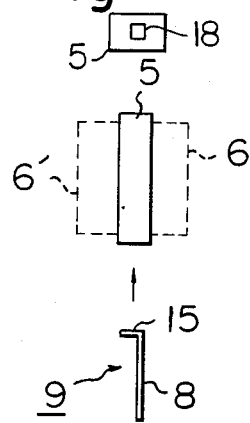 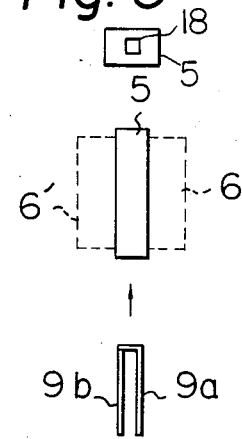

4,682,207

SEMICONDUCTOR DEVICE INCLUDING LEADLESS PACKAGES AND A BASE PLATE FOR MOUNTING THE LEADLESS PACKAGES

This is a continuation of co-pending application Ser. No. 476,262 filed on Mar. 17, 1983.

BACKGROUND OF THE INVENTION

The present invention relates to a semiconductor device disposed in a small area.

A module unit of semiconductor devices is used in order to densely dispose semiconductor devices and in order to obtain a small-sized electronic apparatus. Such semiconductor devices (module unit) comprise a plurality of semiconductor integrated circuit chips and other electronic parts, such as condensers, mounted on a ceramic base plate which comprises multilayer printed wiring patterns. The ceramic base plate is mounted on a printed board so that it forms various electronic circuits.

A leadless package (a leadless chip carrier) has been developed in order to dispose semiconductor packages in a small area. The leadless package comprises electrode films formed on the surface instead of lead terminals projecting from the side surface of the package. A plurality of leadless packages are mounted on a ceramic base plate which is mounted on a printed board, so that each leadless package is connected to a circuit pattern formed on the printed board. These leadless packages are used especially when there is a strong demand for dense mounting of semiconductor packages. Therefore, the surface of the ceramic base plate must be effectively used for mounting the leadless packages and also the surface of the printed board must be effectively used for mounting the ceramic base plate.

In the semiconductor devices comprising leadless packages according to the prior art, the leadless packages are mounted by soldering only on one main surface of the ceramic base plate. Therefore, semiconductor devices of the prior art do not effectively use the area of the ceramic base plate surface and the printed board surface.

SUMMARY OF THE INVENTION

The present invention was made with consideration given to the above-mentioned point. An object of the present invention is to provide a semiconductor device which can satisfy the demand for the dense mounting of electronic parts.

A semiconductor device according to the present invention comprises a plurality of leadless packages, each of which comprises a semiconductor chip housed therein and a plurality of electrodes formed on a surface thereof. The semiconductor device also includes a base plate for mounting the leadless packages and has conductor patterns formed on both of two main surfaces of the base plate, to which the electrodes of the leadless package are soldered.

BRIEF DESCRIPTION OF THE DRAWINGS

FIG. 3 is a plan view of a semiconductor device according to the present invention for explaining the process of producing the same;

FIG. 4 is a side view taken along the direction of the arrow IV in FIG. 3;

FIG. 5 is a side view of another semiconductor device according to the present invention and is similar to that of FIG. 4;

DESCRIPTION OF THE PREFERRED EMBODIMENTS

Figure 1:
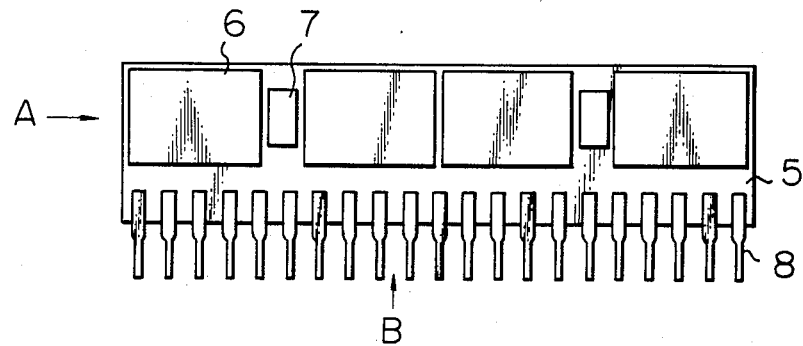
FIG. 1 is a plan view of a semiconductor device according to the present invention.
Figure 1A:
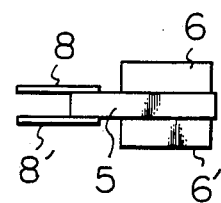
FIG. 1A is a side view taken along the direction of arrow A in FIG. 1.
Figure 1B:
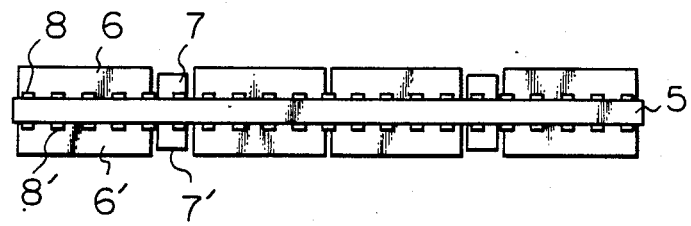
FIG. 1B is a side view taken along the direction of arrow B in FIG. 1.

The embodiments of the present invention are described hereinafter with reference to the drawings. An embodiment of the present invention is illustrated in FIGS. 1, 1A, and 1B. A ceramic base plate 5, leadless packages 6 and 6', condensers 7 and 7', and lead pins 8 and 8' are illustrated in the drawings. Wiring patterns (not shown) are printed on both of the two main surfaces of the ceramic base plate 5 so that electronic parts such as the leadless packages 6 and 6' can be attached thereto. Also, the leadless packages 6 and 6' and the condensers 7 and 7' are mounted on both of the two main surfaces of the ceramic base plate 5. Therefore, the number of electronic parts mounted on the ceramic base plate is increased as compared with the prior art. Each of the leadless packages 6 and 6' houses, for example, a memory IC chip. The condensers 7 and 7' are used as by-pass condensers. If the memory capacity of the memory IC chip is 64k bit, then a memory module of 64k words×8 bits or 512k words×1 bit can be manufactured in accordance with the illustrated embodiment.

The lead pins 8 and 8' are attached to each edge of both of the main surfaces of the base plate 5 and project therefrom in parallel with each other and in parallel with the main surface. The ceramic base plate 5 is disposed perpendicular to a printed board and is attached thereto.

Figure 2:
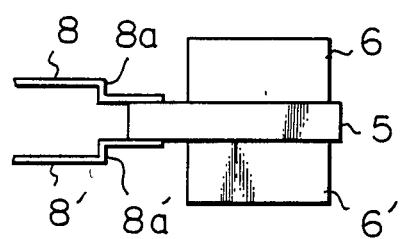
FIG. 2 is a side view of another semiconductor device according to the present invention and is similar to that of FIG. 1(A)

The lead pin 8 or the lead pin 8' or both may be bent so as to form a shoulder 8a or 8a', as is shown in FIG. 2, for increasing the strength of and the stability of the lead pins when the lead pins are mounted on the printed board.

Figure 6:
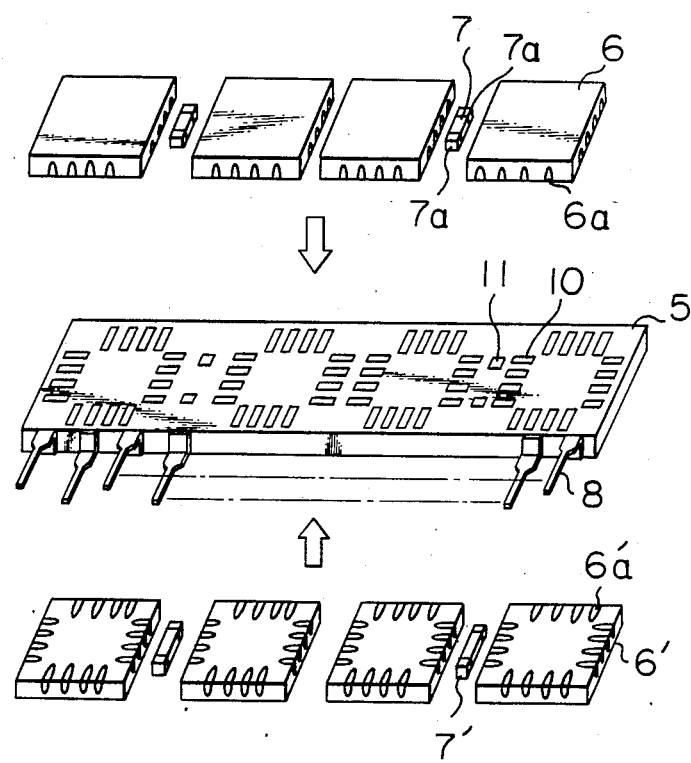
FIG. 6 is a perspective view of the assembling process of the semiconductor device of FIG. 5.

Another embodiment of the present invention which is more preferable than the previously mentioned embodiment is described hereinafter with reference to FIGS. 3 to 6. A plurality of green sheets of alumina, each of which has printed patterns thereon, are laminated and burned so as to comprise a multilayer ceramic base plate 5. Electrode pad patterns 10 and 11 are printed on upper and lower main surfaces (FIG. 6) of the ceramic base plate 5 where the leadless package 6 and the condenser 7 are to be mounted. Each leadless package 6 comprises a semiconductor chip (not shown) housed therein and a plurality of electrodes formed on the four side surfaces and lower surface thereof (FIG. 6). Each electrode pad pattern 10 corresponds to an electrode 6a of the leadless package 6. Also, each electrode pad pattern 11 corresponds to an electrode 7a formed at each end of the condenser 7 (FIG. 6). Lead pins 8 to be attached to the ceramic base plate 5 are punched from a sheet of metal to form a lead frame 9. The tip of each lead pin 8 is perpendicularly folded, as illustrated in FIG. 4. The folded tip 15 is soldered to a pad pattern 18 printed on a lower side surface of the ceramic base plate 5 in FIG. 4. The melting point of the solder used for securing the lead frame to the ceramic base plate 5 is higher than that of the solder used for securing the leadless packages to the ceramic base plate 4 in a subsequent process. The length of the folded tip 15 is less than the thickness of the ceramic base plate 5. The lead frame 9 is cut along the dash-dot line in FIG. 3 after being soldered to the ceramic base plate 5 so as to form separated lead pins 8. Two lead frames 9a and 9b, the tip of each being folded in opposite directions, may be soldered to the ceramic bse plate 5, as is illustrated in FIG. 5. In this arrangement, the lead pins of the lead frames 9a and 9b are alternately disposed. A perspective view of this arrangement is illustrated in FIG. 6. Due to this arrangement, the stability of the ceramic base plate 5 is enhanced when the plate 5 is mounted on the printed board since the lead pins are disposed in two rows. After the lead pins 8 are attached to the ceramic base plate 5, a solder paste is coated on the electrode pad patterns 10 and 11 on the upper and lower main surfaces of the ceramic base plate 5 by means of a printing method. After that, leadless packages 6 and condensers 7 are mounedd on the upper main surface of the ceramic base plate 5. The leadless packages 6 and the condensers 7 are adhered to the electrode pad patterns 10 and 11, respectively, with the soldering paste coated thereon. Then the ceramic base plate 5 is turned upside down and placed on an adequate support. Further, leadless packages 6' and condensers 7' are mounted on the new upper surface of the ceramic base plate 5. Then the ceramic base plate 4 is heated in a furnace so that the leadless packages 6 and 6' and the condensers 7 and 7' are simultaneously soldered to both of the main surfaces of the ceramic base plate 5.

In order to enhance the adhesiveness of the solder paste before it is heated, another adhesive agent may be coated on a part of the ceramic base plate 5 corresponding to the center portion of each of the parts (the leadless packages and condensers) to be mounted thereon. Thereby, the parts disposed on the upper and lower surface of the ceramic base plate 5 are securely adhered to the ceramic base plate 5 both before and during the heating process for soldering the parts.

In the semiconductor device assembled in the above-mentioned manner, the lead pins 8 are secured to the side surface of the ceramic base plate 5 instead of being secured to the main surface thereof. Therefore, the entire area of each of the main surfaces of the ceramic base plate 5 is effectively used for mounting the parts, as compared with the embodiments of FIGS. 1 and 2. Also, such an arrangement of the lead pins 8 ensures that during the process of printing the solder paste onto the electrode pad patterns 10 and 11, the mask for printing the solder paste closely contacts the ceramic base plate surface so that the printing solder paste precisely corresponds to the mask pattern, with the result that short-circuiting between the adjacent electrode pad patterns is avoided.

Figure 7A:
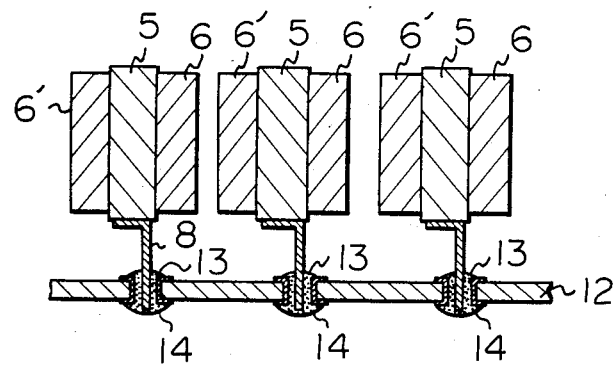
FIG. 7A is a sectional view of semiconductor devices according to the present invention, the devices being secured to a printed board.

The ceramic base plate 5 which mounts the leadless packages 6 and 6' on both of the main surfaces is mounted on a printed board 12 (FIG. 7A) in such a manner that a lead pin 8 is inserted into a through hole 13 of the printed circuit board 12 and is secured thereto with solder 14.

Figure 7B:
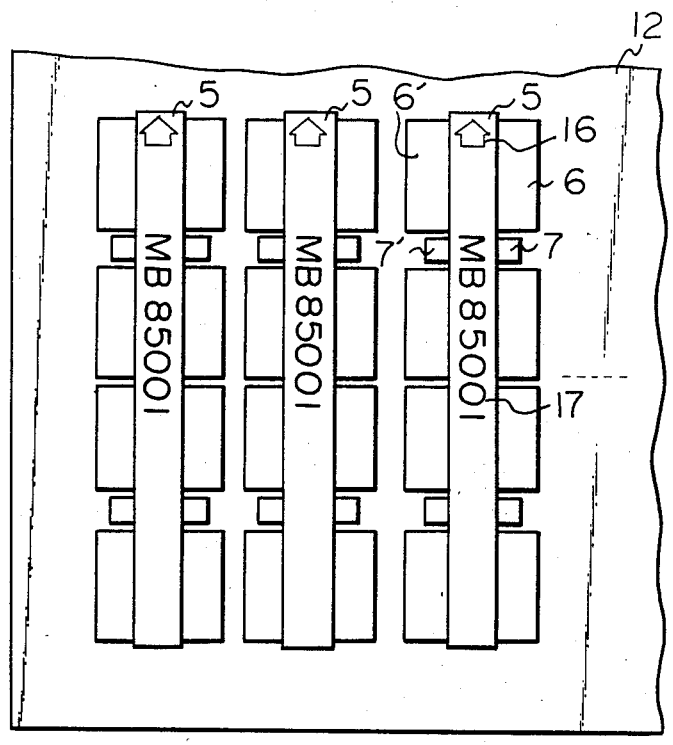
FIG. 7B is a plan view of the semiconductor devices of FIG. 7A.

FIG. 7B is a plan view of the printed circuit board 12 on which semiconductor devices of the present invention are mounted. It is preferable to print an identifying number 17 and an index mark 16 on the upper surface of each base plate 5, so that erroneous mounting of the semiconductor device is avoided and each semiconductor device is easily distinguished.

The distribution or location of the parts mounted on the ceramic base plate 5 is not limited to that illustrated in the drawings. Also, resistances or other electronic parts may be mounted on the ceramic base.

As was mentioned above, by means of the semiconductor device according to the present invention, electronic parts can be densely mounted due to the effective utilization of the surface area of the semiconductor device.

We claim:

1. A semiconductor device for mounting on a printed circuit board, comprising:
   a plurality of leadless packages, each of said leadless packages comprises:
   a semiconductor chip housed therein; and
   a plurality of electrodes formed on a surface of said leadless package;
   a base plate having two main surfaces on which said leadless packages are mounted and having a side surface formed along one edge of said base plate, said base plate having conductor patterns formed on both of said two main surfaces, said conductor patterns having said electrodes soldered thereto, and said side surface aving pad patterns formed thereon, said base plate capable of being mounted on the printed circuit board in such a manner that said main surfaces are perpendicular to the surface of the printed circuit board; and
   a plurality of lead pins which project from only one edge of said base plate in a direction parallel to said two main surfaces, each of said lead pins having a connecting portion perpendicularly folded, the length of said connecting portion being less than the thickness of said base plate, said connecting portion connected to respective ones of said pad patterns formed on said side surface along said one edge of said base plate so that said main surfaces are free from said lead pins.

2. A semiconductor device as set forth in claim 1, wherein said lead pins are disposed in two rows, the folding direction of each of said lead pins in one of said two rows being opposite to the folding direction of each of said lead pins in the other of said two rows, and wherein said lead pins in said two rows are alternately disposed.

3. A semiconductor device as set forth in claim 1, wherein said base plate is a multilayer ceramic plate.

4. A semiconductor device as set forth in claim 1, wherein said semiconductor chip is a semiconductor memory chip.

5. A semiconductor device as set forth in claim 1, wherein said base plate is mounted on a printed circuit board in such a manner that said two main surfaces of said base plate are perpendicular to said printed circuit board.

6. A semiconductor device capable of being mounted on a printed circuit board, comprising:
   leadless packages having electrodes formed on surfaces thereof;

a base plate having two main surfaces on which said leadless packages are mounted, having a side surface, and having conductor patterns formed on both of said two main surfaces, said conductor patterns having said electrodes of said leadless packages soldered thereto, and said side surface having pad patterns formed thereon, said base plate capable of being mounted on the printed circuit board in such a manner that said main surfaces are perpendicular to the surface of the printed circuit board; and lead pins soldered to only said side surface of said base plate and extending in a direction substantially parallel to said two main surfaces, each of said lead pins having a perpendicularly folded connecting portion soldered to respective pad patterns formed on said side surface of said base plate, the length of said connecting portion being less than the thickness of said base plate, and said main surfaces being free from said lead pins.

7. Leadless packages as set forth in claim 6, wherein said base plate is a multilayer ceramic plate.

* * * * *

UNITED STATES PATENT AND TRADEMARK OFFICE
CERTIFICATE OF CORRECTION

PATENT NO. : 4,682,207
DATED : JULY 21, 1987
INVENTOR(S) : HIDEHIKO AKASAKI ET AL.

It is certified that error appears in the above-identified patent and that said Letters Patent is hereby corrected as shown below:

FRONT PAGE [63] "1983." should be --1983, abandoned.--.

Col. 2, line 16, after "board;" insert --and--.

Col. 3, line 17, "bse" should be --base--.

Col. 4, line 22, "pluraity" should be --plurality--;
      line 25, "pluraity" should be --plurality--;
      line 33, "aving" should be --having--.

Signed and Sealed this

Twenty-sixth Day of January, 1988

Attest:

DONALD J. QUIGG

*Attesting Officer*      *Commissioner of Patents and Trademarks*